(12) United States Patent
Yu et al.

(10) Patent No.: US 7,807,574 B2
(45) Date of Patent: Oct. 5, 2010

(54) ETCHING METHOD USING HARD MASK IN SEMICONDUCTOR DEVICE

(75) Inventors: Jae-Seon Yu, Kyoungki-do (KR); Sang-Rok Oh, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 638 days.

(21) Appl. No.: 11/801,657

(22) Filed: May 10, 2007

(65) Prior Publication Data
US 2008/0160771 A1 Jul. 3, 2008

(30) Foreign Application Priority Data
Jan. 3, 2007 (KR) ............ 10-2007-0000748

(51) Int. Cl.
*H01L 21/302* (2006.01)

(52) U.S. Cl. ............ 438/689; 438/592; 438/618; 438/622; 438/637; 438/706; 257/E21.311; 257/E21.314

(58) Field of Classification Search ........ 438/689, 438/745, 754, 756, 757, FOR. 100, FOR. 109, 438/FOR. 385, FOR. 388, 911, 592, 618, 438/622, 637, 706, 709, 717
See application file for complete search history.

(56) References Cited

U.S. PATENT DOCUMENTS

2001/0005622 A1* 6/2001 Kim et al. ............ 438/592
2004/0058541 A1* 3/2004 Ono et al. ............ 438/689
2005/0233521 A1* 10/2005 Park ............ 438/257
2005/0282357 A1* 12/2005 Takayama et al. ............ 438/458
2006/0246711 A1* 11/2006 Lehr et al. ............ 438/622
2007/0082296 A1* 4/2007 Yang et al. ............ 430/311
2007/0212889 A1* 9/2007 Abatchev et al. ............ 438/717
2007/0215986 A1* 9/2007 Manger et al. ............ 257/632

FOREIGN PATENT DOCUMENTS

| KR | 1997-0007789 | 5/1997 |
| KR | 10-2005-0058916 | 6/2005 |
| KR | 1020060010932 | 2/2006 |
| KR | 1020060127250 | 12/2006 |

OTHER PUBLICATIONS

"Handbook of Plasma Processing Technology. Fundamentals, Etching, Deposition, and Surface Interactions", ed. By S. M. Rossnagel et al., (C) 1990 Noyes Publications, p. 19.*
S. M. Sze "Semiconductor Devices. Physics and Technology. 2nd Edition", © 2002 John Wiley and Sons, pp. 428-430\.*

* cited by examiner

*Primary Examiner*—N Drew Richards
*Assistant Examiner*—Kyoung Lee
(74) *Attorney, Agent, or Firm*—Blakely, Sokoloff, Taylor & Zafman (57) ABSTRACT

An etching method in a semiconductor device includes forming a nitride-based first hard mask layer over a target etch layer, forming a carbon-based second hard mask pattern over the first hard mask layer, etching the first hard mask layer using the second hard mask pattern as an etch barrier to form a first hard mask pattern, cleaning a resultant structure including the first hard mask pattern, and etching the target etch layer using the second hard mask pattern as an etch barrier.

22 Claims, 11 Drawing Sheets

ETCHING METHOD USING HARD MASK IN SEMICONDUCTOR DEVICE

CROSS-REFERENCE TO RELATED APPLICATIONS

The present invention claims priority of Korean patent application number 10-2007-0000748, filed on Jan. 3, 2007 which is incorporated by reference in its entirety.

BACKGROUND OF THE INVENTION

The present invention relates to a method for fabricating a semiconductor device, and more particularly, to an etching method using a hard mask in a semiconductor device.

For a gate formation in a semiconductor device fabrication process, as a pattern size has been reduced, a loss of a gate hard mask nitride layer has been increased during performing a gate etching method and a landing plug contact etching method. A height of a gate hard mask nitride layer which is finally remaining after etching the landing plug contact to prevent a self aligned contact (SAC) fail has been increased, and a deposition thickness of the gate hard mask nitride layer has been increased as well. Accordingly, it is difficult to obtain a vertical cross-sectional profile since the deposition thickness of the gate hard mask nitride layer is large during etching the gate hard mask nitride layer. Also, a bowing phenomenon or a sloped profile may be obtained and thus, gate critical dimension uniformity within a wafer may be degraded due to the bowing phenomenon for each location of the wafer or the different slope angles.

As for etching a gate electrode formed of polysilicon and tungsten, a photoresist layer formed over the gate hard mask nitride layer and serving as an etch barrier is removed. Then, the gate electrode is etched using the gate hard mask nitride layer as an etch barrier. Due to the use of the gate hard mask layer as the etch barrier, a polymer generated during the etching of the gate hard mask nitride layer may be removed, thereby removing un-etch or residues generated during etching a gate metal.

However, in the case of etching the gate electrode formed of tungsten using the gate hard mask nitride layer as the etch barrier, a fluorine-based etch gas is used. In this case, since an etch selectivity of the fluorine-based etch gas is low to the gate hard mask nitride layer, a large loss may be generated on the gate hard mask nitride layer. Accordingly, it is necessary to increase an initial deposition thickness of the gate hard mask nitride layer.

Figure 1A:
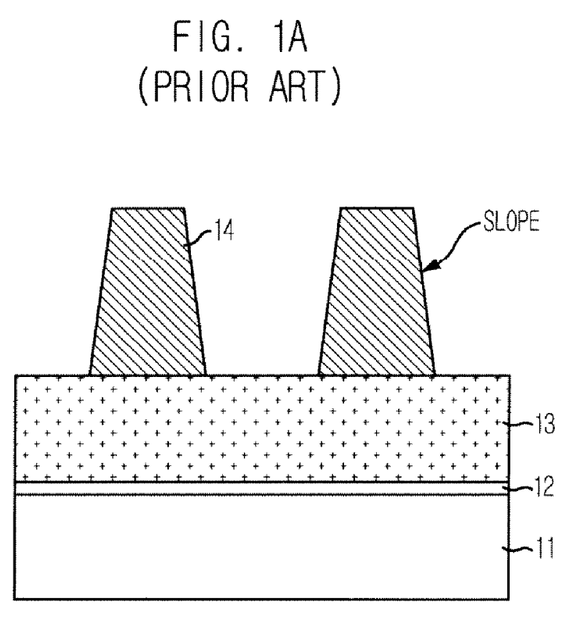
FIG. 1A illustrates a slope profile of a typical gate hard mask pattern.
Figure 1B:
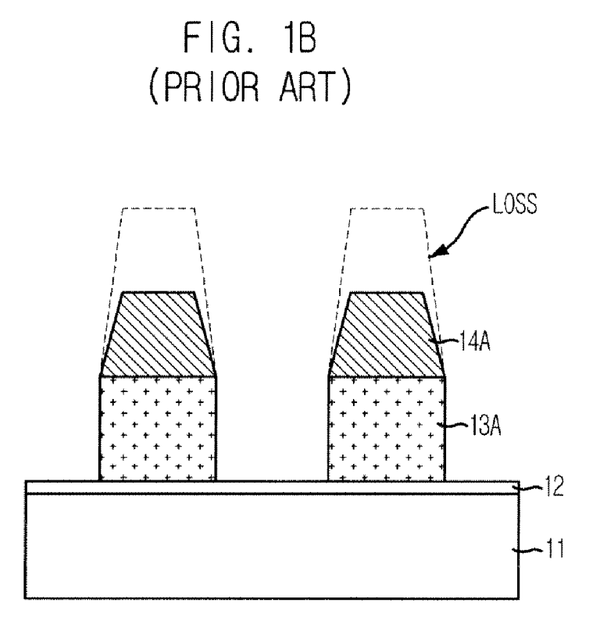
FIG. 1B illustrates a loss on a typical gate hard mask pattern generated during etching a gate electrode.

FIG. 1A illustrates a slope profile of a typical gate hard mask pattern, and FIG. 1B illustrates a loss on a typical gate hard mask pattern generated during etching a gate electrode. As shown in FIGS. 1A and 1B, a gate insulation layer 12 is formed over a substrate 11, and a gate electrode layer 13 is formed over the gate insulation layer 12. A gate hard mask pattern 14 is formed over the gate electrode 13. The gate hard mask pattern 14 includes a nitride layer. Then, a gate etching process is performed to form a patterned gate electrode 13A.

An etch profile of the gate pattern 14 has a slope as shown in FIG. 1A. A loss is generated on the gate hard mask pattern 14 during the gate etching process as shown in FIG. 1B. A remaining gate hard mask pattern after the gate etching process is identified with a reference numeral 14A. Limitations shown in FIGS. 1A and 1B may be generated at a bit line etching process using a hard mask (e.g., a bit line hard mask nitride layer) as well.

SUMMARY OF THE INVENTION

Embodiments of the present invention are directed toward providing an etching method in a semiconductor device capable of obtaining a vertical profile by reducing a loss on a hard mask during an etching process, and securing a uniform line width.

In accordance with one aspect of the present invention, there is provided an etching method in a semiconductor device, including: forming a nitride-based first hard mask layer over a target etch layer; forming a carbon-based second hard mask pattern over the first hard mask layer; etching the first hard mask layer using the second hard mask pattern as an etch barrier to form a first hard mask pattern; cleaning a resultant structure including the first hard mask pattern; and etching the target etch layer using the second hard mask pattern as an etch barrier.

In accordance with another aspect of the present invention, there is provided an etching method in a semiconductor device, including: forming a target etch layer; forming a hard mask nitride layer over the target etch layer; forming an amorphous carbon pattern over the hard mask nitride layer; etching the hard mask nitride layer to form a hard mask nitride pattern; cleaning a resultant structure including the hard mask nitride pattern; and etching the target etch layer using the amorphous carbon pattern as an etch barrier.

DESCRIPTION OF SPECIFIC EMBODIMENTS

Figure 2A:
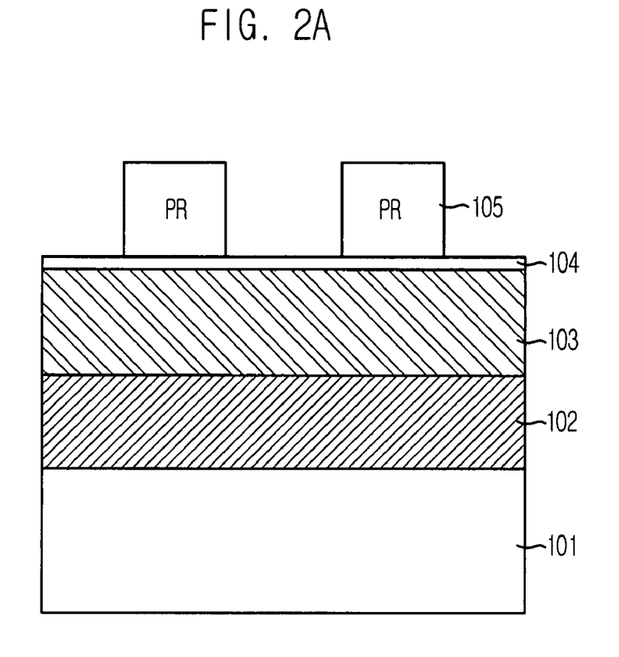
FIGS. 2A to 2F illustrate an etching method in a semiconductor device in accordance with an embodiment of the present invention.

FIGS. 2A to 2F illustrate an etching method in a semiconductor device in accordance with an embodiment of the present invention. As shown in FIG. 2A, a target etch layer 101 is formed. The target etch layer 101 can include a polysilicon layer or a metal layer. The metal layer can be one selected from a group consisting of tungsten (W), tungsten nitride (WN), tungsten silicide ($WSi_x$), titanium (Ti), titanium nitride (TiN), and titanium silicide ($TiSi_x$).

A nitride-based first hard mask layer 102 is formed over the target etch layer 101. A carbon-based second hard mask layer 103 is formed over the first hard mask layer 102. For instance, the first hard mask layer 102 is a silicon nitride ($Si_3N_4$) layer, and the second hard mask layer 103 is an amorphous carbon layer.

An anti-reflective coating layer 104 is formed over the second hard mask layer 103. Then, a photoresist layer (not shown) is formed over the anti-reflective coating layer 104. Then, a photo-exposure and developing process is performed on the photoresist layer (not shown) to form a photoresist pattern 105. The anti-reflective coating layer 104 prevents scattered reflection during the photo-exposure process and includes silicon oxynitride (SiON) layer.

Figure 2B:
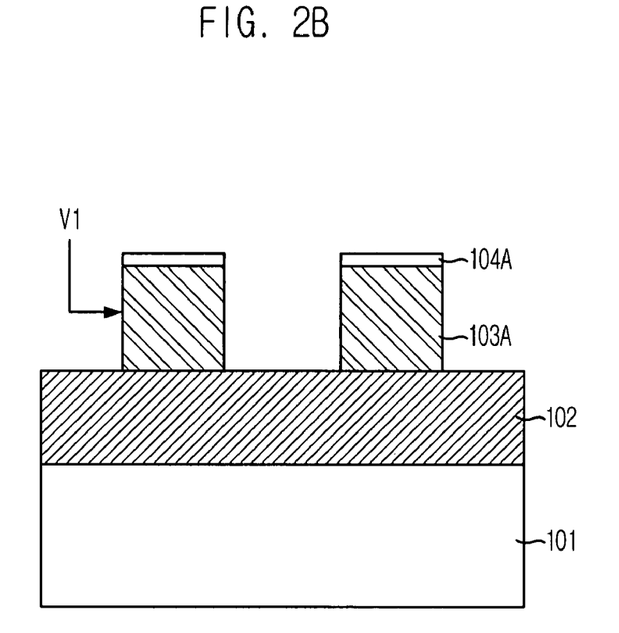

As shown in FIG. 2B, the anti-reflective coating layer 104 and the second hard mask layer 103 are etched using the photoresist pattern 105 as an etch barrier. As a result, an anti-reflective coating pattern 104A and a second hard mask pattern 103A which have the same line width as that of the photoresist pattern 105 are formed. During etching the second hard mask layer 103, the photoresist pattern 105 is removed and thus, may not remain.

During etching the carbon-based second hard mask layer 103, nitrogen ($N_2$), oxygen ($O_2$), and hydrogen ($H_2$) gases are used. Accordingly, the second hard mask pattern 103A can obtain a vertical profile V1.

Figure 2C:
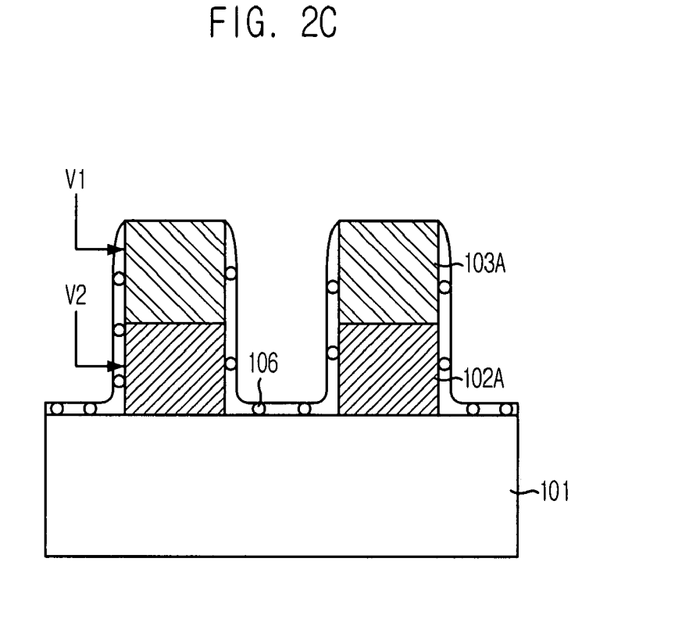

As shown in FIG. 2C, the first hard mask layer 102 is etched using the anti-reflective coating pattern 104A and the second hard mask pattern 103A as an etch barrier to form a first hard mask pattern 102A. During etching the first hard mask layer 102, the anti-reflective coating pattern 104A is removed, and only the second hard mask pattern 103A remains to a certain thickness. An etch polymer 106 is formed over the above resultant structure.

During etching the nitride-based first hard mask layer 102, oxygen ($O_2$), argon (Ar), a CF-based gas such as tetrafluoromethane ($CF_4$) or hexafluoroethane ($C_2F_6$), a CHF-based gas such as trifluoromethane ($CHF_3$), and a mixture thereof are used. As a result, the first hard mask pattern 102A can obtain a vertical profile V2. Accordingly, both the second hard mask pattern 103A and the first hard mask pattern 102A have the vertical profiles V1 and V2, respectively.

Figure 2D:
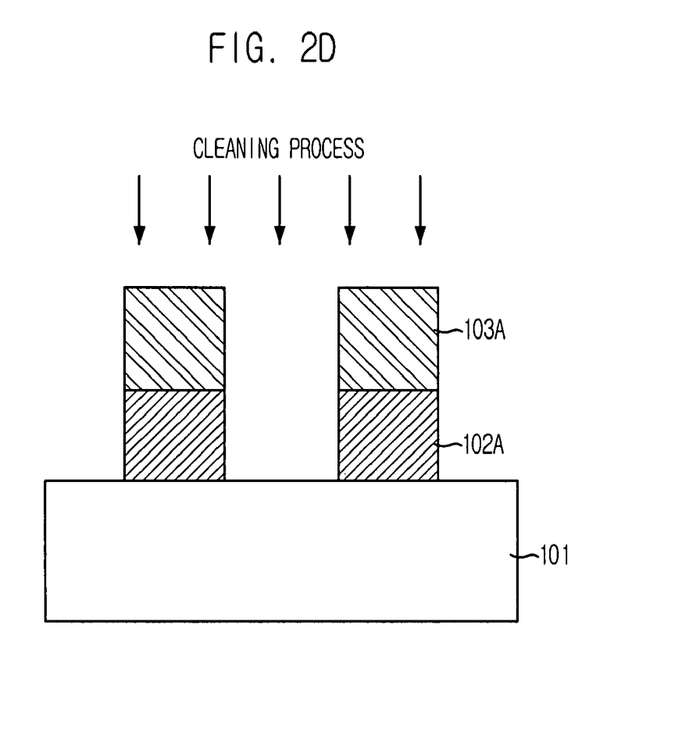

As shown in FIG. 2D, a cleaning process is performed to selectively etch the etch polymer 106 but leave the second hard mask pattern 103A serving as an etch barrier during a subsequent etching process. The cleaning process to remove the etch polymer 106 includes using a cleaning chemical selected from a group consisting of hydrogen fluoride (HF), ozone ($O_3$), buffered oxide etchant (BOE) including $NH_4F$ and HF, an ammonium hydroxide-peroxide mixture (APM) including ammonium hydroxide ($NH_4OH$), hydrogen peroxide ($H_2O_2$), and $H_2O$. Also, a sulfuric acid-peroxide: mixture (SPM) including sulfuric acid ($H_2SO_4$) and $H_2O_2$, or solvent can be added to the cleaning process using the cleaning chemical.

When the cleaning process is performed using the cleaning chemical, since the second hard mask pattern 103A includes the carbon-based material, the carbon-based material has an insoluble property which does not dissolve in the above mentioned cleaning chemical. Accordingly, the etch polymer 106 can be selectively removed, and un-etch or residues cannot be generated by the etch polymer 106 during a subsequent etching process. The first hard mask pattern 102A including the nitride-based material does not dissolve in the above mentioned cleaning chemical as well.

Figure 2E:
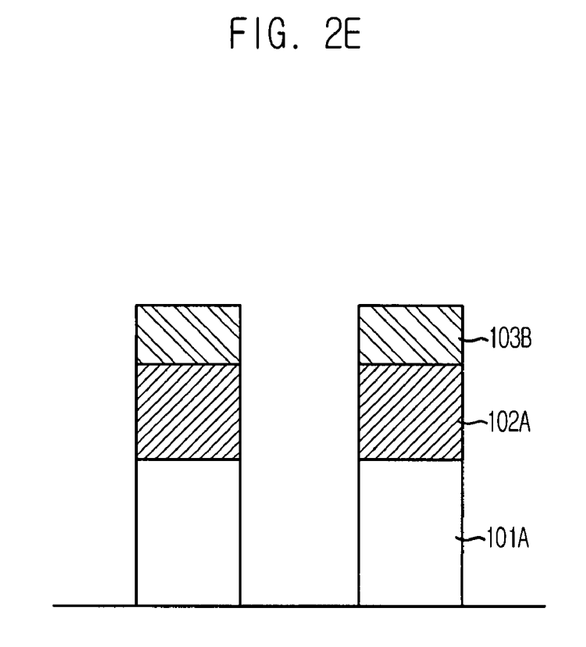

As shown in FIG. 2E, the target etch layer 101 is etched using the second hard mask pattern 103A to form a pattern 101A. After the etching of the target etch layer 101, a certain portion of the second hard mask pattern 103A is removed and a remaining portion of the second hard mask pattern is referred to as a remaining second hard mask pattern identified with a reference numeral 103B.

During etching the target etch layer 101, since the remaining second hard mask pattern 103B protects the first hard mask pattern 102A which is disposed underneath the remaining second hard mask pattern 103B. As a result, a loss on a thickness of the first hard mask pattern 102A is not incurred.

Accordingly, the first hard mask layer 102 can be initially formed with a small thickness, and the small thickness of the first hard mask layer 102 makes it possible to have the vertical profile during etching the first hard mask layer 102 (see the reference denotation V2 of FIG. 2C). As a result, a critical dimension uniformity of the pattern 101A within a wafer can be improved.

Figure 2F:
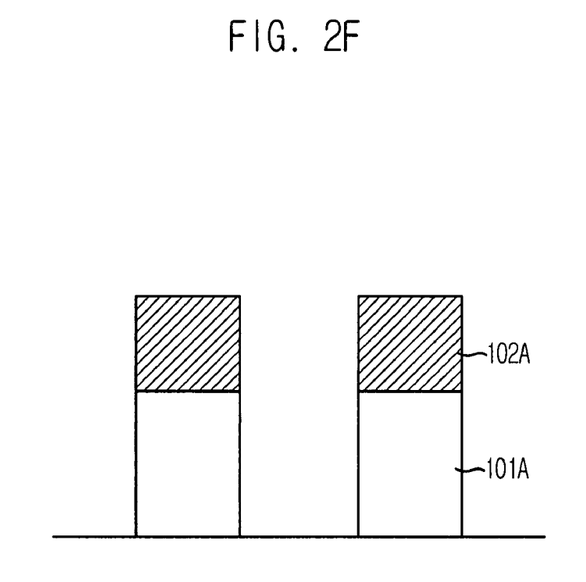

As shown in FIG. 2F, the remaining second hard mask pattern 103B is removed. Since the second hard mask pattern 103B includes the carbon-based material, the second hard mask pattern 103B is removed via a photoresist stripping process using an oxygen ($O_2$) gas. The etching method using the nitride-based first hard mask layer and the carbon-based second hard mask layer can be applied to a gate etching process and a bit line etching process.

Figure 3A:
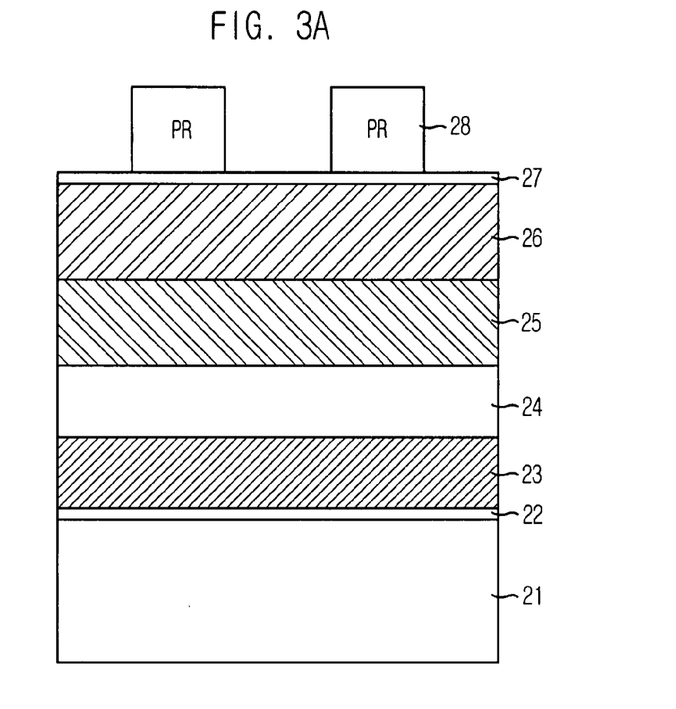
FIGS. 3A to 3G illustrate the etching method shown in FIGS. 2A to 2F applied to a gate etching process in accordance with another embodiment of the present invention.

FIGS. 3A to 3G illustrate the etching method shown in FIGS. 2A to 2F applied to a gate etching process in accordance with another embodiment of the present invention. As shown in FIG. 3A, a gate insulation layer 22 is formed over a substrate 21. Although not shown, before the formation of the gate insulation layer 22, a device isolation structure may be formed in the substrate 21, and in the case of using a recess gate structure, a recess pattern may be formed.

A gate polysilicon layer 23 is formed over the gate insulation layer 22. A gate metal layer 24 is formed over the gate polysilicon layer 23. The gate metal layer 24 includes one selected from a group consisting of tungsten (W), tungsten nitride (WN), tungsten silicide ($WSi_x$), titanium (Ti), titanium nitride (TiN), and titanium silicide ($TiSi_x$). Although not shown, a diffusion barrier layer may be disposed between the gate polysilicon layer 23 and the gate metal layer 24. For instance, the diffusion barrier layer includes one selected from a group consisting of a Ti layer, a TiN layer, a WN layer, and a combination thereof.

A gate hard mask layer 25 is formed over the gate metal layer 24 as a first hard mask layer. The gate hard mask layer 25 includes a nitride layer. The gate hard mask layer 25 is formed to a thickness as small as that supposed to remain so as to prevent a self aligned contact (SAC) fail after a subsequent gate etching process since a loss is not generated on the gate hard mask layer 25 during a subsequent gate etching process (the reason why the loss is not generated on the gate hard mask layer 25 during the subsequent gate etching process will be explained hereinafter). For instance, the gate hard mask layer 25 includes a silicon nitride layer.

An amorphous carbon layer 26 is formed as a second hard mask layer over the gate hard mask layer 25, and a silicon oxynitride (SiON) layer 27 is formed over the amorphous carbon layer 26. The SiON layer 27 is an anti-reflective coating layer to prevent scattered reflection during a subsequent photo-exposure process. Then, a photoresist layer is formed over the SiON layer 27, and a photo-exposure and a developing process is performed to form a gate mask pattern 28.

Figure 3B:
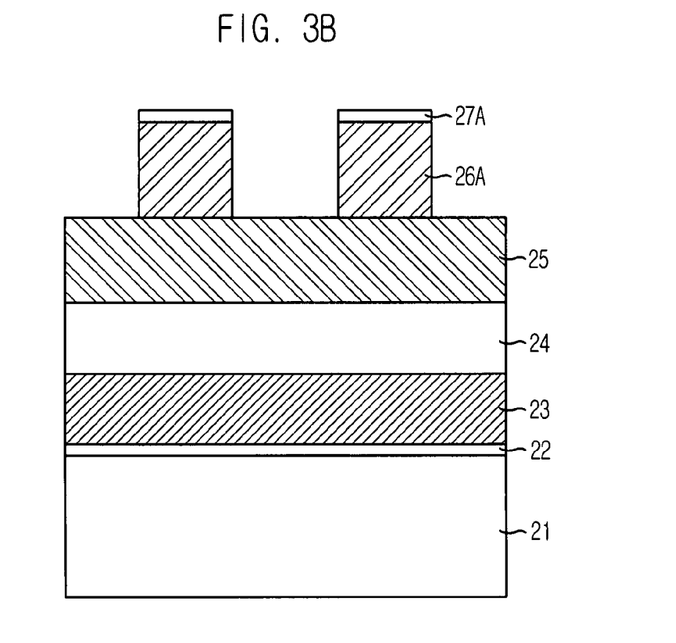

As shown in FIG. 3B, the SiON layer 27 and the amorphous carbon layer 26 are etched using the gate mask pattern 28 as an etch barrier. As a result, a SiON pattern 27A and an amorphous carbon pattern 26A having the same line with as that of the gate mask pattern 28 are formed. During etching the amorphous carbon layer 26, the gate mask pattern 28 is removed and thus, may not remain. During etching the amorphous carbon layer 26, nitrogen ($N_2$), oxygen ($O_2$), and hydrogen ($H_2$) gases are used to obtain the amorphous carbon pattern 26A formed in a vertical profile V1.

Figure 3C:
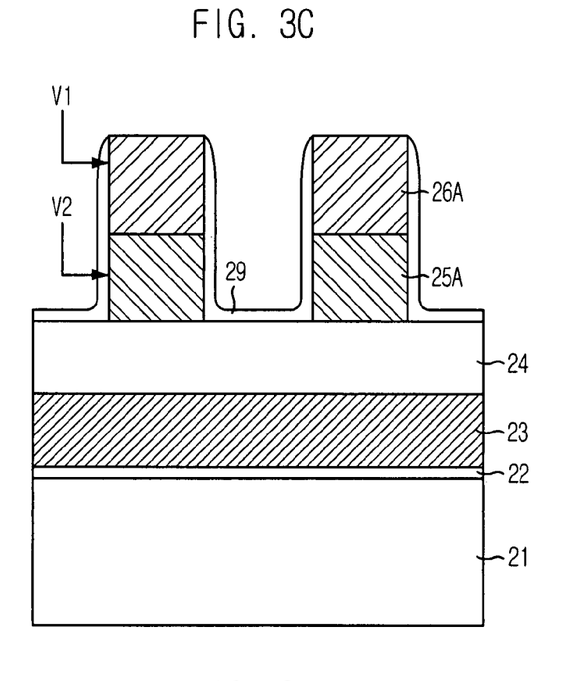

As shown in FIG. 3C, the gate hard mask layer 25 is etched using the SiON pattern 27A and the amorphous carbon pattern 26A as an etch barrier to form a gate hard mask pattern 25A. During etching the gate hard mask layer 25, the SiON pattern 27A is removed, and only the amorphous carbon pattern 26A remains to a certain thickness. An etch polymer 29 is formed over the above resultant structure obtained by the etching.

During etching the nitride-based gate hard mask layer 25, $O_2$, Ar, a CF-based gas including $CF_4$ or $C_2F_6$, CHF-based gas including $CHF_3$ and mixture thereof are used. As a result, a gate hard mask pattern 25A is formed in a vertical profile V2. Accordingly, both the amorphous carbon pattern 26A and the gate hard mask pattern 25A have the vertical profiles V1 and V2.

Figure 3D:
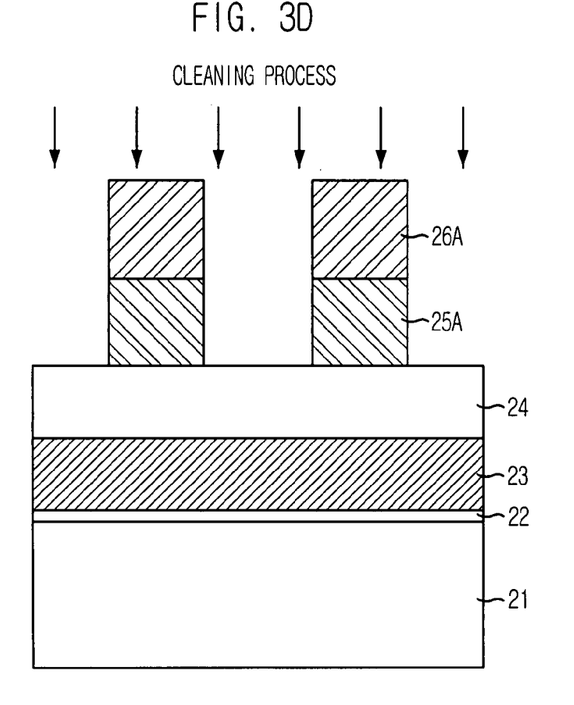

As shown in FIG. 3D, a cleaning process is performed to selectively etch the etch polymer 29 but leave the amorphous carbon pattern 26A serving as an etch barrier during a subsequent etching process. The cleaning process to remove the etch polymer 29 includes using a cleaning chemical selected from a group consisting of HF, $O_3$, buffered oxide etchant (BOE) including $NH_4F$ and HF, and an ammonium hydroxide-peroxide mixture (APM) including $NH_4OH$, $H_2O_2$, and $H_2O$. A sulfuric acid-peroxide mixture (SPM) including $H_2SO_4$ and $H_2O_2$ or a solvent can be added to the cleaning process using the above mentioned cleaning chemical.

When the cleaning process is performed using the cleaning chemical, since the amorphous carbon pattern 26A includes the carbon-based material, the carbon-based material has an insoluble property which does not dissolve in the above mentioned cleaning chemical. Accordingly, the etch polymer 29 can be selectively removed, and un-etch or residues generated by the etch polymer 29 can be reduced during a subsequent etching process. The gate hard mask pattern 25A including the nitride-based material does not dissolve in the above mentioned cleaning chemical as well.

Figure 3E:
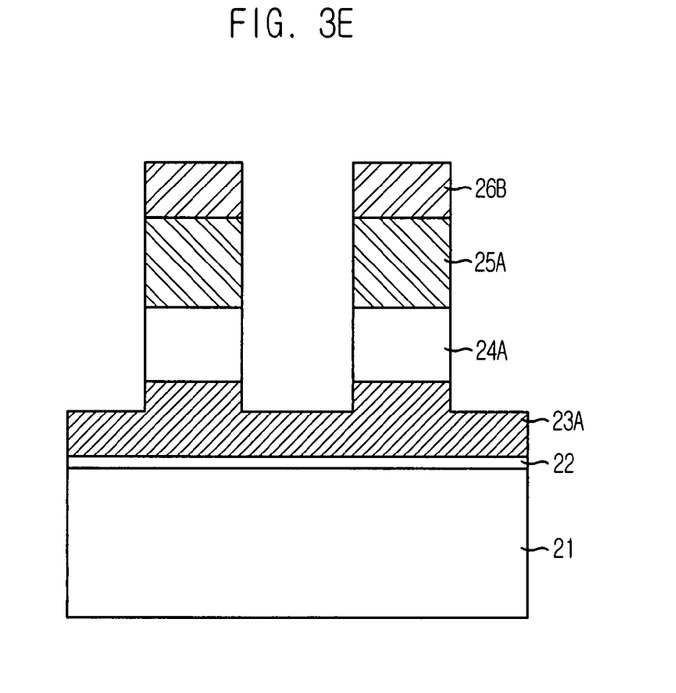

As shown in FIG. 3E, a gate metal layer 24 is etched using the amorphous carbon pattern 26A as an etch barrier to form a gate metal pattern 24A. During etching the gate metal layer 24, since the amorphous carbon pattern 26A protects the gate hard mask pattern 25A disposed underneath the amorphous carbon pattern 26A, a loss is not generated on the gate hard mask pattern 25A. Accordingly, the gate hard mask layer 25 can be initially formed to a small thickness and the small thickness of the gate hard mask layer 25 makes it possible to obtain the vertical profile V2 as shown in FIG. 3C during etching the gate hard mask layer 25.

The etching of the gate metal layer 24 is performed using one selected from a group consisting of $BCl_3$, $C_xF_x$ (e.g., $C_4F_8$), $NF_x$ (e.g., $NF_3$), $SF_x$ (e.g., $SF_6$), $Cl_2$, and a mixture gas, which includes at least two thereof as an etch gas at a high density plasma etcher. For the high density plasma etcher, inductively coupled plasma (ICP), a decoupled plasma source (DPS), and an electron cyclotron resonance (ECR) may be used. If the $BCl_3$, $C_xF_y$ (e.g., $C_4F_8$), $NF_x$ (e.g., $NF_3$), or $SF_x$ (e.g., $SF_6$) gas is used, a flow rate thereof ranges from about 10 sccm to about 50 sccm. If the $Cl_2$ gas is used, a flow rate thereof ranges from about 50 sccm to 200 sccm.

The following etching conditions are additionally controlled to obtain the gate metal pattern 24A formed in a vertical profile. The high density plasma etcher including the ICP or the DPS uses a source power ranging from about 500 W to about 2,000 W. Also, a gas selected from a group consisting of $O_2$ with a flow rate ranging from about 1 sccm to about 20 sccm, $N_2$ with a flow rate ranging from about 1 sccm to about 100 sccm, Ar with a flow rate ranging from about 50 sccm to about 200 sccm, He with a flow rate ranging from about 50 sccm to about 200 sccm, and a mixture gas including at least two thereof is used as an addition gas.

The high plasma etcher including the ECR uses a microwave power ranging from about 1,000 W to about 3,000 W. A gas selected from a group consisting of $O_2$ with a flow rate ranging from about 1 sccm to about 20 sccm, $N_2$ with a flow rate ranging from about 1 sccm to about 100 sccm, Ar with a flow rate ranging from about 50 sccm to about 200 sccm, He with a flow rate ranging from about 50 sccm to about 200 sccm, and a mixture gas including at least two thereof is used as an addition gas.

A gate polysilicon layer 23 is etched using the amorphous carbon pattern 26A as an etch barrier to form a gate polysilicon pattern 23A. After the etching of the gate polysilicon layer 23, a portion of the amorphous carbon pattern 26A is removed, and a remaining portion of the amorphous carbon pattern is referred to as a remaining amorphous carbon patterned identified with a reference numeral 26B. The etching of the gate polysilicon layer 23 includes using a $Cl_2$ or HBr gas.

Figure 3F:
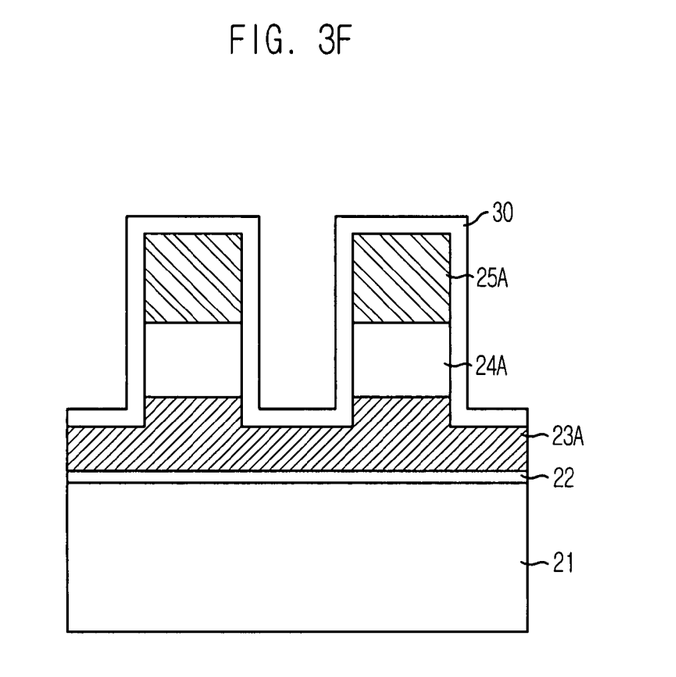

As shown in FIG. 3F, the remaining amorphous carbon pattern 26B is removed. Since the remaining amorphous carbon pattern 26B includes the carbon-based material, the removal of the remaining amorphous carbon pattern 26B is performed under a photoresist layer stripping condition using an $O_2$ gas.

A passivation layer 30 is formed over an entire surface of the resultant structure obtained by the removal of the remaining amorphous carbon pattern 26B. The passivation layer 30 includes a nitride layer, and prevents the gate metal pattern 24A from being abnormally oxidized during a subsequent oxidation process.

Figure 3G:
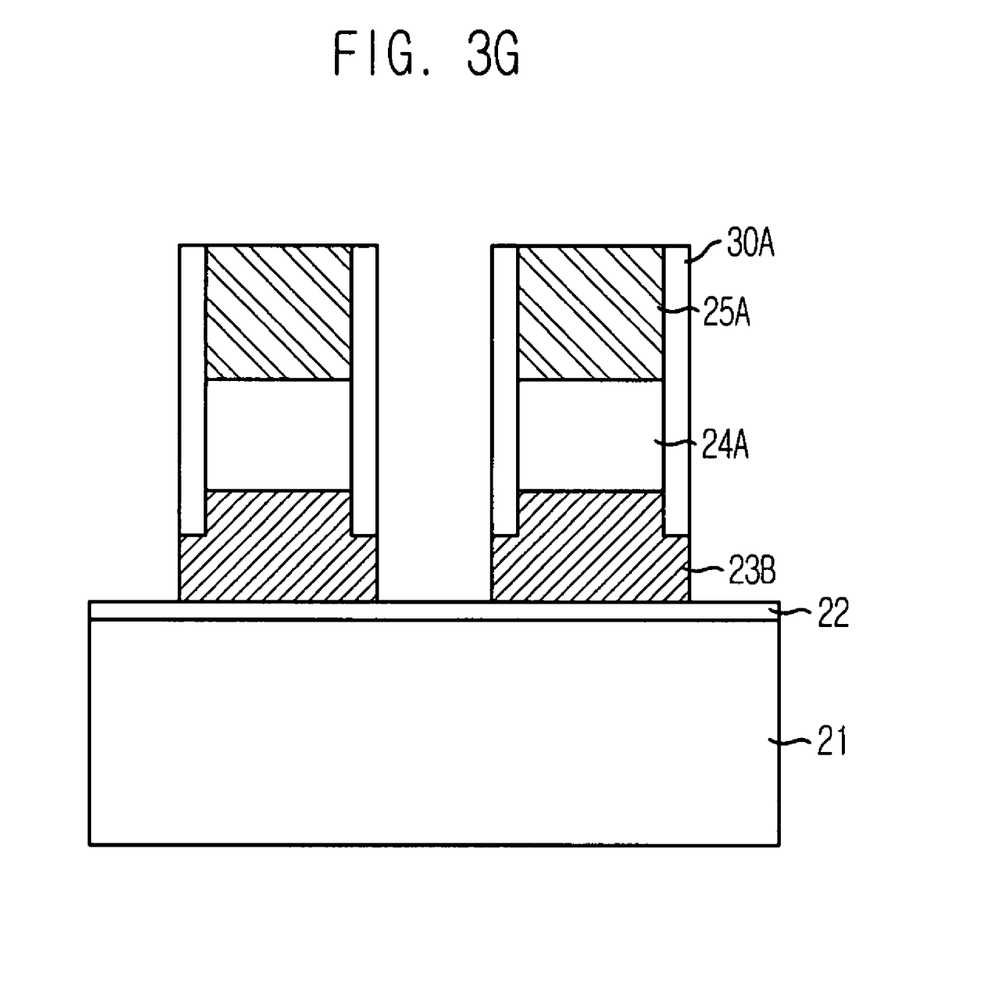

As shown in FIG. 3G, the passivation layer 30 is selectively etched to form a plurality of spacers 30A over sidewalls of the gate hard mask pattern 25A, the gate metal pattern 24A, and the gate polysilicon pattern 23A. Continuously, the gate polysilicon pattern 23A is etched until the gate insulation layer 22 is exposed. Accordingly, a final gate polysilicon pattern 23B has a convex shape.

The etching of the passivation layer 30 is performed using a blanket etch process. The blanket etch process includes using a mixture gas including at least two gases selected from a group consisting of nitrogen trifluoride ($NF_3$), tetrafluoromethane ($CF_4$), sulfur hexafluoride ($SF_6$), chlorine ($Cl_2$), oxygen ($O_2$), argon (Ar), helium (He), hydrogen bromide (HBr), and nitrogen ($N_2$).

During the etching of the gate polysilicon layer 23, a mixture gas including $Cl_2$, $O_2$, HBr, and $N_2$ is used to increase an etch selectivity with respect to the gate insulation layer 22. After the etching of the gate polysilicon layer 23, a cleaning process is performed. The cleaning process includes using a solvent, BOE, $H_2O$, and an $O_3$ gas. The cleaning process is performed using one selected from a group consisting of a dipping method, a spin type rotating method, and a combination thereof.

In FIGS. 3A to 3G, the partial etching of the gate polysilicon layer, the formation of the passivation layer, and the etching of the remaining gate polysilicon layer are performed. However, the etching method shown in FIGS. 2A to 2F can also be applied to other gate etching processes of etching the gate polysilicon layer at once without using the passivation layer.

Figure 4A:
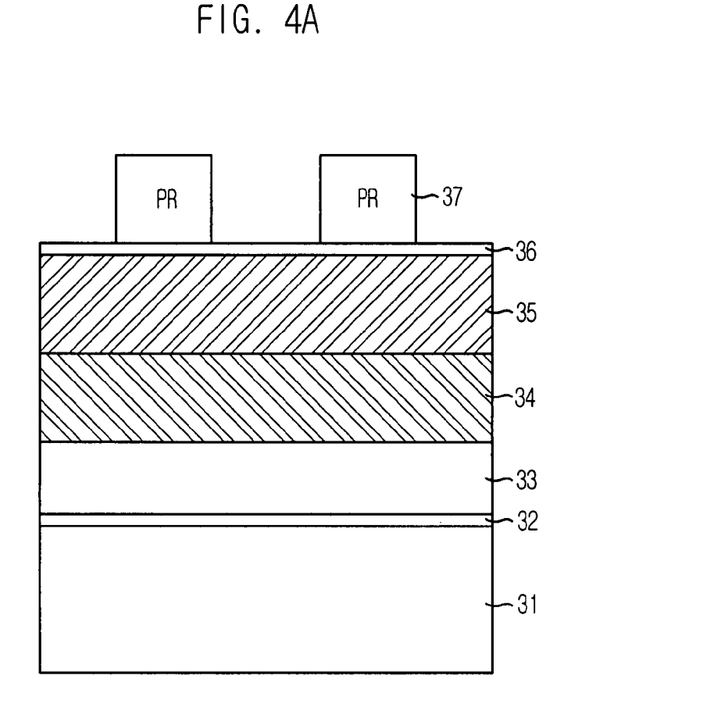
FIGS. 4A to 4F illustrate the etching method shown in FIGS. 2A to 2F applied to a bit line etching process in accordance with another embodiment of the present invention.

FIGS. 4A to 4F illustrate the etching method shown in FIGS. 2A to 2F applied to a bit line etching process in accordance with another embodiment of the present invention. As shown in FIG. 4A, a barrier metal layer 32 is formed over a substrate 31. The substrate 31 can be an insulation layer or a bit line contact. The barrier metal layer 32 can include a Ti layer, a TiN layer, or a stacked structure of a Ti layer and a TiN layer.

A bit line metal layer 33 is formed over the barrier metal layer 32. The bit line metal layer 33 includes a W layer. A bit line hard mask layer 34 is formed over the bit line metal layer 33 as a first hard mask layer. The bit line hard mask layer 34 includes a nitride layer.

The bit line hard mask layer 34 is formed to a thickness as small as that supposed to remain so as to prevent a self aligned contact fail (SAC) after a subsequent bit line etching process since a loss is not generated on the bit line hard mask layer 34 during a subsequent bit line etching process (the reason will be explained hereinafter). For instance, the gate hard mask layer 34 includes a silicon nitride layer.

An amorphous carbon layer 35 is formed over the bit line hard mask layer 34 as a second hard mask layer. A SiON layer 36 is formed over the amorphous carbon layer 35. The SiON layer 36 is an anti-reflective coating layer to reduce scattered reflection during a subsequent photo-exposure process. A photoresist layer is formed over the SiON layer 35, and then, a photo-exposure and developing process is performed to form a bit line mask pattern 37.

Figure 4B:
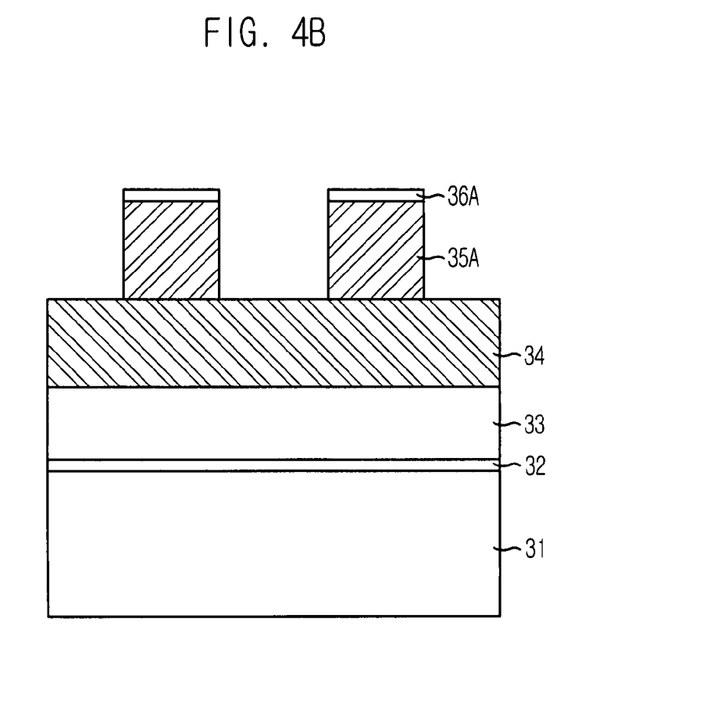

As shown in FIG. 4B, the SiON layer 36 and the amorphous carbon layer 35 are etched using the bit line mask pattern 37 as an etch barrier. As a result, a SiON pattern 36A and an amorphous carbon pattern 35A having the same line width as that of the bit line mask pattern 37 are formed. During etching the amorphous carbon layer 35, the bit line mask pattern 37 is removed and may not remain. A mixture gas including $N_2$, $O_2$, and $H_2$ is used to etch the amorphous carbon layer 35. As a result, the amorphous carbon pattern 35A is formed in a vertical profile V11.

Figure 4C:
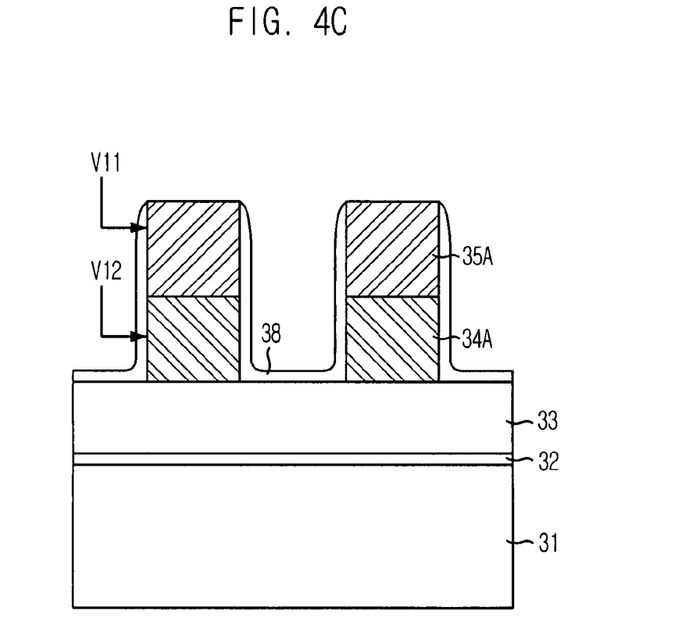

As shown in FIG. 4C, the bit line hard mask layer 34 is etched using the SiON pattern 36A and the amorphous carbon pattern 35A as an etch barrier to form a bit line hard mask pattern 34A. During etching the bit line hard mask layer 34, the SiON pattern 36A is removed, but the amorphous carbon pattern 35A remains to a certain thickness. An etch polymer 38 is formed over the resultant structure obtained by the etching.

During etching the nitride-based bit line hard mask layer 34, $O_2$, Ar, a CF-based gas including $CF_4$ or $C_2F_6$, a CHF-based gas including $CHF_3$ and mixture thereof is used to obtain the bit line hard mask pattern 34A formed in a vertical profile V12. Accordingly, both the amorphous carbon pattern 35A and the bit line hard mask pattern 34A have the vertical profiles V11 and V12.

Figure 4D:
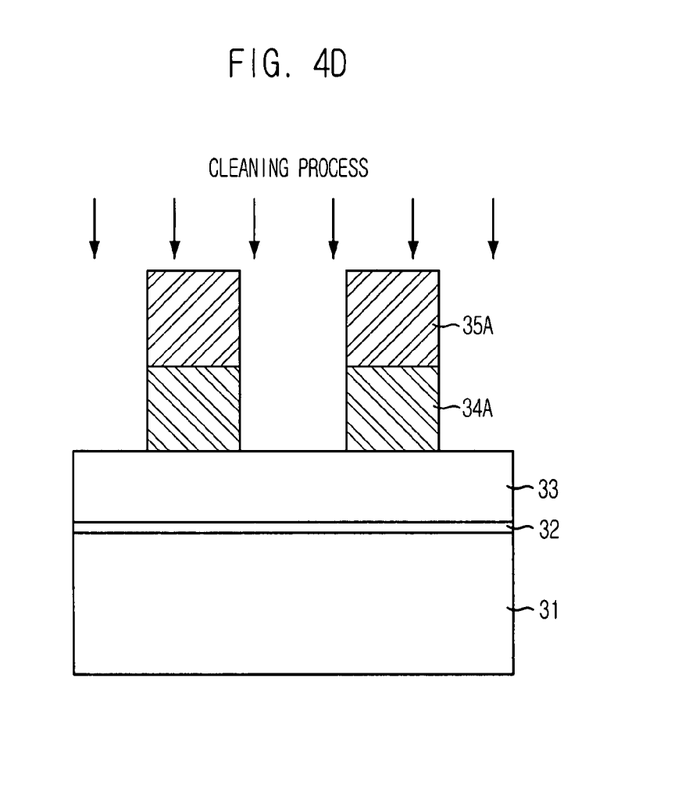

As shown in FIG. 4D, a cleaning process is performed to leave the amorphous carbon pattern 35A serving as an etch barrier during a subsequent etching process and selectively remove the etch polymer 38. The cleaning process to remove the etch polymer 38 is performed using a cleaning chemical selected from a group consisting of HF, $O_3$, BOE including $NH_4F$ and HF, an APM including $NH_4OH$, $H_2O_2$ and $H_2O$. A SPM including $H_2SO_4$ and $H_2O_2$, or a solvent can be added to the cleaning process using the cleaning chemical.

When the cleaning process is performed using the cleaning chemical, since the amorphous carbon pattern 35A includes the carbon-based material, the carbon-based material has an insoluble property which does not dissolve in the above mentioned cleaning chemical. As a result, the etch polymer 38 can be selectively removed and accordingly, un-etch or residues generated by the etch polymer 38 can be reduced during a subsequent etching process. Furthermore, the bit line hard mask pattern 34A including the nitride-based material does not dissolve in the above mentioned chemical.

Figure 4E:
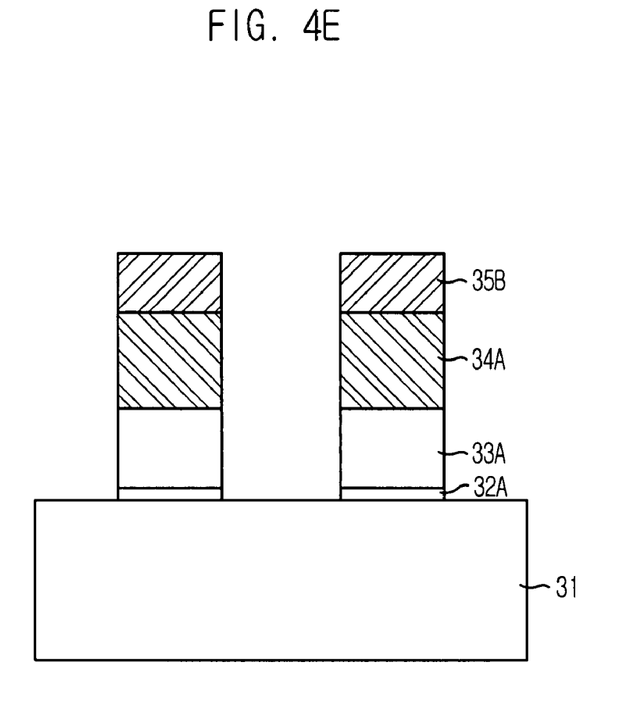

As shown in FIG. 4E, the bit line metal layer 33 is etched using the amorphous carbon pattern 35A as an etch barrier to form a bit line metal pattern 33A. Since the amorphous carbon pattern 35A protects the bit line hard mask pattern 34A during etching the bit line metal layer 33, a loss is not generated on the bit line hard mask pattern 34A. As a result, the bit line hard mask layer 34 can be initially formed to a small thickness. The small thickness of the bit line hard mask layer 34 makes it possible to obtain the vertical profile V12 shown in FIG. 4C after etching the bit line hard mask layer 34.

The etching of the bit line metal layer 33 is performed using a gas selected from a group consisting of $BCl_3$, $C_xF_x$ (e.g., $C_4F_8$), $NF_x$ (e.g., $NF_3$), $SF_x$ (e.g., $SF_6$), $Cl_2$, and a mixture gas, which includes at least two thereof as an etch gas at a high density plasma etcher. For the high density plasma etcher, an inductively coupled plasma (ICP), a decoupled plasma source (DPS), and an electron cyclotron resonance (ECR) may be used. During etching the gate metal layer 24 may be used. If the $BCl_3$, $C_xF_x$ (e.g., $C_4F_8$), $NF_x$ (e.g., $NF_3$), or $SF_x$ (e.g., $SF_6$) gas is used, a flow rate thereof ranges from about 10 sccm to about 50 sccm. If the $Cl_2$ gas is used, a flow rate thereof ranges from about 50 sccm to 200 sccm.

The following etching conditions are additionally controlled to obtain the vertical profile of the bit line metal pattern 33A. The high density plasma etcher including the ICP or the DPS uses a source power ranging from about 500 W to about 2,000 W. Also, a gas selected from a group consisting of $O_2$ with a flow rate ranging from about 1 sccm to about 20 sccm, $N_2$ with a flow rate ranging from about 1 sccm to about 100 sccm, Ar with a flow rate ranging from about 50 sccm to about 200 sccm, He with a flow rate ranging from about 50 sccm to about 200 sccm, and a mixture gas including at least two thereof is used as an addition gas.

The high plasma etcher including the ECR uses a microwave power ranging from about 1,000 W to about 3,000 W. A gas selected from a group consisting of $O_2$ with a flow rate ranging from about 1 sccm to about 20 sccm, $N_2$ with a flow rate ranging from about 1 sccm to about 100 sccm, Ar with a flow rate ranging from about 50 sccm to about 200 sccm, and He with a flow rate ranging from about 50 sccm to about 200 sccm, and a mixture gas including at least two thereof is used as an addition gas.

The barrier metal layer 32 is continuously etched using the amorphous carbon pattern 35A. After the etching of the barrier metal layer 32, a portion of the amorphous carbon pattern 35A is removed, and a remaining portion of the amorphous carbon pattern is referred to as a remaining amorphous carbon pattern identified with a reference numeral 36B. The etching of the barrier metal layer 32 is performed under the same condition as the etching of the bit line metal layer 33.

Figure 4F:
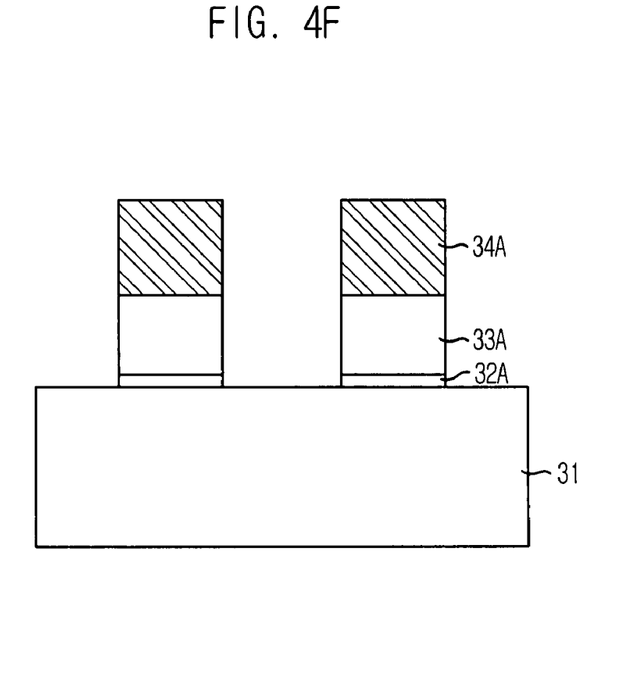

As shown in FIG. 4F, the remaining amorphous carbon pattern 35B is removed. Since the amorphous carbon pattern 35B includes the carbon-based material, the removal of the amorphous carbon pattern 35B is performed under a photoresist layer stripping condition using an $O_2$ gas.

According to the embodiments of the present invention, during performing a gate etching process or a bit line etching process, a vertical profile can be secured. Uniformity of a hard mask nitride layer after the etching process can be improved. Line width uniformity within a wafer due to a vertical profile can be improved as well. As a result, a self-aligned contact (SAC) fail can be reduced at a landing plug contact or storage node contact process, thereby achieving an improvement of yields of products. Furthermore, since the etching process is performed using the hard mask layer formed to a small thickness, a margin of the etching processes can be increased, thereby improving yields of the products.

While the present invention has been described with respect to the specific embodiments, it will be apparent to those skilled in the art that various changes and modifications may be made without departing from the spirit and scope of the invention as defined in the following claims.

What is claimed is:

1. An etching method in a semiconductor device, comprising:
   forming a target etch layer;
   forming a hard mask nitride layer over the target etch layer;
   forming an amorphous carbon pattern over the hard mask nitride layer;
   etching the hard mask nitride layer to form a hard mask nitride pattern;
   cleaning a resultant structure including the hard mask nitride pattern; and
   etching the target etch layer using the amorphous carbon pattern as an etch barrier,
   wherein the forming of the amorphous carbon pattern includes:
      forming an amorphous carbon layer;
      forming a photoresist pattern over the amorphous carbon layer; and
      etching the amorphous carbon layer, wherein the etching of the amorphous carbon layer includes using a mixture gas including $N_2$, $O_2$, and $H_2$.

2. The etching method of claim 1, wherein the cleaning includes using a wet chemical which does not dissolve the amorphous carbon pattern and the hard mask nitride pattern.

3. The etching method of claim 2, wherein the wet chemical includes one selected from a group consisting of HF, buffered oxide etchant (BOE) including $NH_4F$ and HF, an ammonium hydroxide-peroxide mixture (APM) including $NH_4OH$, $H_2O_2$ and $H_2O$.

4. The etching method of claim 3, wherein the cleaning further includes using a sulfuric acid-peroxide mixture (SPM) including $H_2SO_4$ and $H_2O_2$, or a solvent.

5. The etching method of claim 1, wherein the forming of the amorphous carbon pattern further includes:
   forming an anti-reflective coating layer after the forming of the amorphous carbon layer and before the forming of the photoresist pattern.

6. The etching method of claim 5, wherein the anti-reflective coating layer includes a silicon oxynitride (SiON) layer.

7. The etching method of claim 1, wherein the hard mask nitride layer includes a $Si_3N_4$ layer.

8. The etching method of claim 7, wherein the forming of the hard mask nitride pattern includes using one selected from a group consisting of a CF-based gas, a CHF-based gas, $O_2$, Ar and mixture thereof.

9. The etching method of claim 1, wherein the target etch layer includes a metal layer selected from a group consisting of W, WN, $WSi_x$, Ti, TiN, and $TiSi_x$.

10. The etching method of claim 9, wherein the etching of the metal layer includes using a high density plasma etcher selected from a group consisting of inductively coupled plasma (ICP), a decoupled plasma source (DPS), and an electron cyclotron resonance (ECR).

11. The etching method of claim 10, wherein the etching of the metal layer includes using one selected from a group consisting of $BCl_3$, $C_xF_x$, $NF_x$, $SF_x$, $Cl_2$, and a mixture gas including at least two thereof.

12. The etching method of claim 11, wherein $BCl_3$, $C_xF_x$, $NF_x$, or $SF_x$ uses a flow rate ranging from about 10 sccm to about 50 sccm, and $Cl_2$ uses a flow rate ranging from about 50 sccm to about 200 sccm.

13. The etching method of claim 12, wherein the etching of the metal layer using the high density plasma etcher including the ICP or the DPS includes using a source power ranging from about 500 W to about 2,000 W, and a gas selected from a group consisting of $O_2$ with a flow rate ranging from about 1 sccm to about 20 sccm, $N_2$ with a flow rate ranging from about 1 sccm to about 100 sccm, Ar with a flow rate ranging from about 50 sccm to about 200 sccm, He with a flow rate ranging from about 50 sccm to about 200 sccm, and a mixture gas including at least two thereof.

14. The etching method of claim 12, wherein the etching of the metal layer using the high density plasma etcher including the ECR includes using a microwave power ranging from about 1,000 W to about 3,000 W, and a gas selected from a group consisting of $O_2$ with a flow rate ranging from about 1 sccm to about 20 sccm, $N_2$ with a flow rate ranging from about 1 sccm to about 100 sccm, Ar with a flow rate ranging from about 50 sccm to about 200 sccm, He with a flow rate ranging from about 50 sccm to about 200 sccm, and a mixture gas including at least two thereof as an addition gas.

15. The etching method of claim 1, further comprising performing a cleaning process after the etching of the target etch layer.

16. The etching method of claim 15, wherein the performing of the cleaning process after the etching of the target etch layer includes using a solvent, buffered oxide etchant (BOE), $H_2O$, or $O_3$.

17. The etching method of claim 16, wherein the performing of the cleaning process after the etching of the target layer includes using one selected from a group consisting of a dipping method, a spinning method, and a combination thereof.

18. The etching method of claim 1, wherein the target etch layer includes one of a gate structure including a gate polysilicon layer and a gate metal layer, and a bit line structure including a barrier metal layer and a bit line metal layer.

19. The etching method of claim 18, wherein the etching of the gate structure includes:
   etching the gate metal layer; and
   etching the gate polysilicon layer at once.

20. The etching method of claim 18, wherein the etching of the gate structure includes:
   etching the gate metal layer;
   etching a portion of the gate polysilicon layer;
   forming a passivation layer over a resultant surface profile obtained after etching the portion of the gate polysilicon layer;
   selectively etching the passivation layer to form a plurality of spacers; and
   etching a remaining portion of the gate polysilicon layer.

21. The etching method of claim 20, wherein the passivation layer includes a nitride layer.

22. The etching method of claim 21, wherein the etching of the passivation layer includes performing a blanket etch process.

* * * * *